US009537479B2

(12) United States Patent
Song et al.

(10) Patent No.: US 9,537,479 B2
(45) Date of Patent: Jan. 3, 2017

(54) PROGRAMMABLE IMPEDANCE TRANSMITTER FOR SERIAL COMMUNICATION

(71) Applicant: Intel Corporation, Santa Clara, CA (US)

(72) Inventors: Hongjiang Song, Mesa, AZ (US); Yan Song, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 14/107,993

(22) Filed: Dec. 16, 2013

(65) Prior Publication Data

US 2015/0171829 A1 Jun. 18, 2015

(51) Int. Cl.
*H03K 17/16* (2006.01)
*H03K 17/687* (2006.01)

(52) U.S. Cl.
CPC .................................. *H03K 17/687* (2013.01)

(58) Field of Classification Search
CPC ............ H03H 11/28; H03K 19/018585; H03K 17/687
USPC .................................................. 327/387–388
See application file for complete search history.

(56) References Cited

U.S. PATENT DOCUMENTS

| | | | | |
|---|---|---|---|---|
| 6,693,450 B1* | 2/2004 | Volk | .................... | H03K 19/0005 326/30 |
| 6,888,369 B1* | 5/2005 | Wang | .................. | H04L 25/0278 326/21 |
| 7,093,041 B2* | 8/2006 | Gasparik | ............. | G06F 13/4086 326/30 |
| 8,723,573 B1* | 5/2014 | Wang | .................... | G11C 7/1057 327/108 |
| 2006/0017457 A1* | 1/2006 | Pan | .................. | H03K 19/01852 326/32 |
| 2007/0050572 A1* | 3/2007 | Tanaka | ................ | H04L 25/0286 711/154 |
| 2010/0164539 A1* | 7/2010 | Balamurugan | .. | H03K 19/01858 326/30 |

* cited by examiner

*Primary Examiner* — Lincoln Donovan
*Assistant Examiner* — Metasebia Retebo
(74) *Attorney, Agent, or Firm* — Schwabe, Williamson & Wyatt, P.C.

(57) ABSTRACT

Embodiments include apparatuses, methods, and systems for transmitting a data signal over one or more transmission lines. In one embodiment, a transmitter circuit includes a plurality of programmable impedance driver (PID) circuits coupled in parallel with one another to drive a data signal on a transmission line. The individual PID circuits may include a pull-up transistor to receive a pull-up signal, a pull-down transistor to receive a pull-down signal, and first and second resistors coupled in series with one another between the pull-up and pull-down transistors. An output contact may be coupled to a node between the first and second resistors to pass an output signal that is responsive to the pull-up and pull-down signals. The individual PID circuits may further include a switch transistor coupled in parallel with the first and second resistors, and a control contact coupled to the switch transistor to receive a control signal to switch the switch transistor on or off to control an impedance at the output contact.

21 Claims, 6 Drawing Sheets

PROGRAMMABLE IMPEDANCE TRANSMITTER FOR SERIAL COMMUNICATION

FIELD

Embodiments of the present invention relate generally to the technical field of electronic circuits, and more particularly to programmable impedance transmitter circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Voltage-mode high-speed input/output (HSIO) transmitters typically include an array of driver bit-slices to drive a data signal on one or more transmission lines. Such transmitters provide programmable output impedance by enabling or disabling certain driver bit-slices. Accordingly, the output impedance may be adjusted to compensate for process, voltage, and temperature (PVT) variation to meet the impedance specification of the input/output link. However, the typical architectures for HSIO transmitters suffer from several drawbacks, such as a large pad capacitance (Cpad), high power dissipation, and impedance compensation and de-emphasis operations that are coupled together (e.g., one affects operation of the other).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, laptop computer, a set-top box, a gaming console, and so forth.

Figure 1:
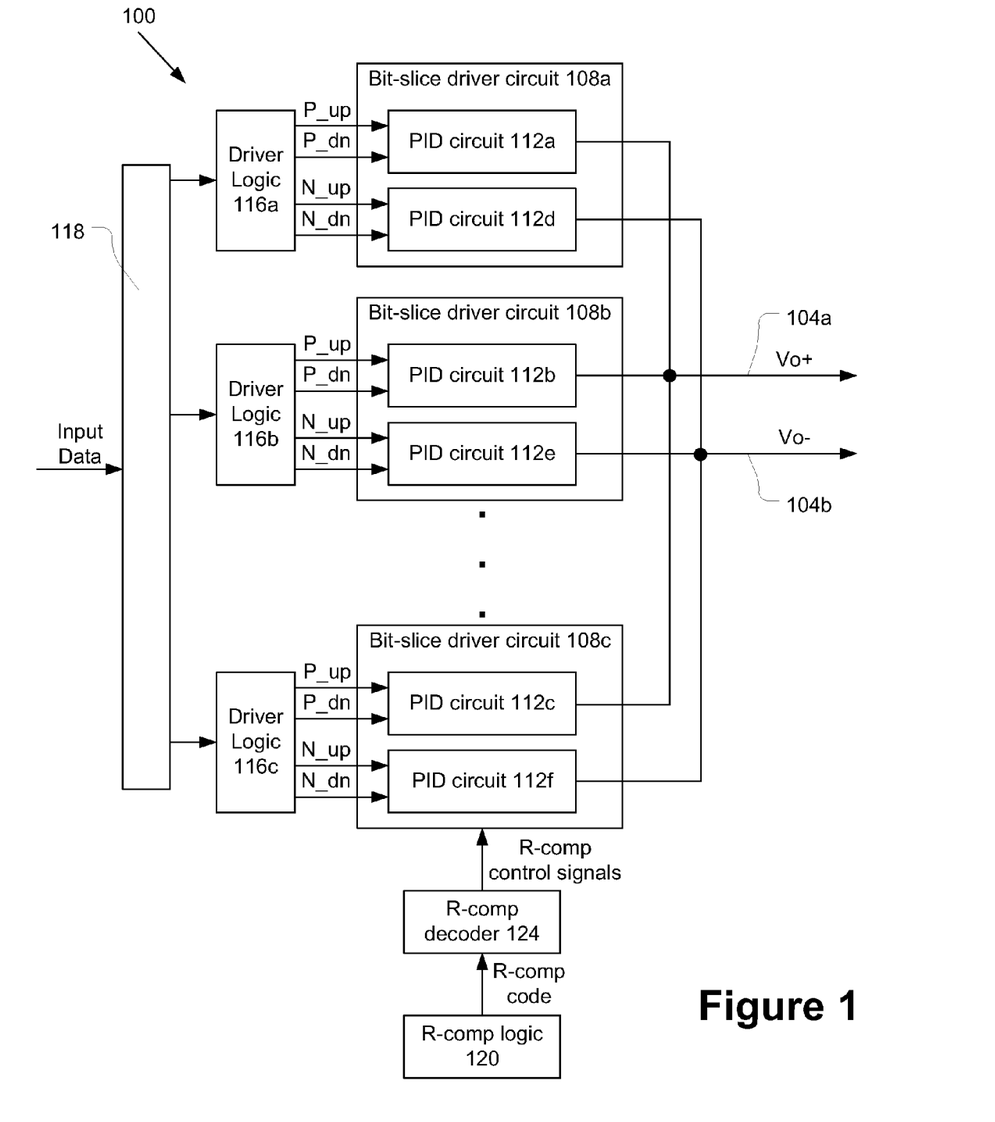
FIG. 1 schematically illustrates transmitter circuit in accordance with various embodiments.

FIG. 1 illustrates a transmitter circuit 100 in accordance with various embodiments. The transmitter circuit 100 may be coupled to one or more transmission lines 104a-b to drive a data signal on the one or more transmission lines 104a-b. The transmitter circuit 100 may be coupled to and/or included in a communication device to enable the communication device to transmit data signals to another communication device via the transmission lines 104a-b. In various embodiments, the transmission lines 104a-b may carry a serial data signal. The transmitter circuit 100 may be a high-speed input/output (HSIO) transmitter, and may use any suitable serial communication protocol, such as Camera Serial Interface (CSI), Mobile Industry Processor Interface (MIPI) M-PHY, Peripheral Component Interconnect express (PCIe), Serial Advanced Technology Attachment, and/or Universal Serial Bus (USB).

In some embodiments, the transmitter circuit 100 may transmit a differential data signal. In these embodiments, the transmitter circuit may drive a positive data signal Vo+ (e.g., one half of the differential data signal) on a first transmission line 104a and a negative data signal Vo− (e.g., the other half of the differential data signal) on a second transmission line 104b. In some embodiments, additional transmission lines may be coupled between the communication devices, for example to carry a ground signal and/or electrical power. In some embodiments, at least a portion of the transmission lines 104a-b may be part of a cable connected between the communication devices.

In other embodiments, the transmitter circuit 100 may transmit a single-ended data signal on a single transmission line.

In various embodiments, the transmitter circuit 100 may include a plurality of bit-slice driver circuits 108a-c. The transmitter circuit 100 may include any suitable number of bit-slice driver circuits. The individual bit-slice driver circuits 108a-c may include a first programmable impedance driver (PID) circuit 112a-c (also referred to as a positive PID circuit 112a-c) coupled to the first transmission line 104a and a second PID circuit 112d-f (also referred to as a negative PID circuit 112d-f) coupled to the second transmission line 104b. The PID circuits 112a-f may drive the output signals on the respective transmission lines 104a-b. In various embodiments, the PID circuits 112a-f may be voltage-mode drivers.

The positive PID circuits 112a-c may be coupled in parallel with one another and coupled to the first transmission line 104a to drive the positive data signal Vo+. The negative PID circuits 112d-f may be coupled in parallel with one another and coupled to the second transmission line 104b to drive the negative data signal Vo−.

In various embodiments, the transmitter circuit 100 may further include a plurality of driver logic 116a-c coupled to the respective bit-slice driver circuits 108a-c. The driver logic 116a-c may receive an input data signal to be transmitted over the transmission lines 104a-b, and may generate one or more drive signals to control a voltage level of an output signal produced by the individual PID circuits based on the input data signal. For example, the driver logic 116a-c may generate a positive pull-up signal (P_up) to increase the output voltage of the positive PID circuit 112a-c, a positive pull-down signal (P_dn) to decrease the output voltage of the positive PID circuit 112a-c, a negative pull-up signal (N_up) to increase the output voltage of the negative PID circuit 112d-f, and/or a negative pull-down signal (N_dn) to decrease the output voltage of the negative PID circuit 112d-f. The operation of the PID circuits 112a-f responsive to the drive signals is discussed further below with respect to FIGS. 2 and 3.

In various embodiments, the transmitter circuit 100 may further include de-emphasis circuitry 118 to perform a de-emphasis operation on the incoming data signal before passing the input data signal to the driver logic 116a-c. During the de-emphasis operation, the de-emphasis circuitry 118 may pass a delayed and inverted version of the input data signal to a programmable number of the driver logic 116a-c. The number of driver logic 116a-c that receive a delayed and inverted version of the input data signal may be selected to achieve one of a plurality of de-emphasis levels for the output signal transmitted on transmission lines 104a-b. The de-emphasis operation of de-emphasis logic 118 is further discussed below with respect to FIG. 5.

In various embodiments, an impedance presented by the individual PID circuits 112a-f may be switchable between two or more values responsive to one or more control signals received by the PID circuit 112a-f. Accordingly, the output impedance presented by the transmitter circuit 100 at the transmission line 104a or 104b may be adjusted by adjusting the impedance of the individual bit-slice driver circuits 112a-c or 112d-f, respectively.

In various embodiments, the transmitter circuit 100 may include R-comp logic 120 to control the impedances of the individual PID circuits. R-comp logic 120 is shown coupled to the bit-slice driver circuit 108c for ease of illustration, however it will be apparent that the R-comp logic 120 may be coupled to the plurality of bit-slice driver circuits 108a-c to control the respective PID circuits 112a-f. In some embodiments, the transmitter circuit 100 may further include an R-comp decoder 124 coupled between the R-comp logic 120 and the PID circuits 112a-f to generate the control signals to control the PID circuits 112a-f based on an R-comp code generated by the R-comp logic 120. The impedance compensation provided by R-comp logic 120 and R-comp decoder 124 is further discussed below.

Figure 2:
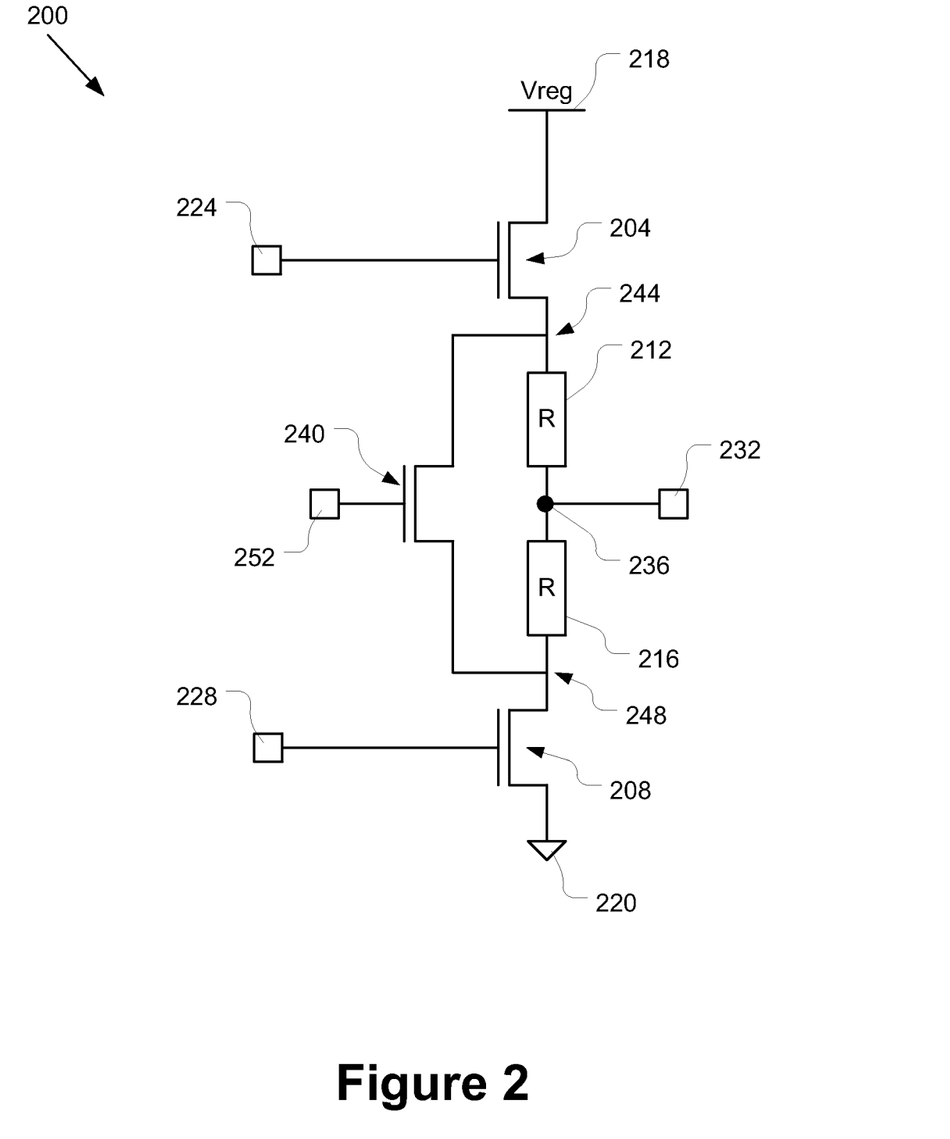
FIG. 2 illustrates an example programmable impedance driver (PID) circuit that may be employed by the transmitter circuit of FIG. 1, in accordance with various embodiments.

FIG. 2 illustrates an example PID circuit 200 in accordance with various embodiments. In some embodiments, the PID circuit 200 may be included in the PID circuits 112a-f of transmitter circuit 100.

PID circuit 200 may include a pull-up transistor 204 and a pull-down transistor 208. The PID circuit 200 may further include a first resistor 212 and a second resistor 216 coupled in series with one another between the pull-up transistor 204 and the pull-down transistor 208. For example, the first resistor 212 may be coupled to a drain terminal of the pull-up transistor 204 and the second resistor 216 may be coupled to a source terminal of the pull-down transistor 208. The first resistor 212 and the second resistor 216 may have a same impedance value (R). The pull-up transistor 204 may be coupled to a supply contact 218 (e.g. at a source terminal of the pull-up transistor 204) to receive a supply voltage (Vreg). The pull-down transistor 208 may be coupled to a ground potential 220 (e.g., at a drain terminal of the pull-down transistor 208).

The pull-up transistor 204 may receive a pull-up signal at a gate terminal of the pull-up transistor via a pull-up contact 224 coupled to the gate terminal of the pull-up transistor 204. The pull-up signal may be, for example, the P_up or N_up signal generated by the drive circuitry 116a-c of transmitter circuit 100 based on the input data signal. The pull-down transistor 204 may receive a pull-down signal at a gate terminal of the pull-down transistor 208 via a pull-down contact 228 coupled to the gate terminal of the pull-down transistor 208. The pull-down signal may be, for example, the P_dn or N_dn signal generated by the drive circuitry 116a-c of transmitter circuit 100 based on the input data signal.

In various embodiments, the PID circuit 200 may include an output contact 232 coupled to a node 236 between the first resistor 212 and the second resistor 216. The PID circuit 200 may generate an output signal based on the pull-up and pull-down signals, and may pass the output signal to the output contact 232. For example, the pull-up signal may selectively turn on the pull-up transistor 204 to conductively connect the output contact 232 to the supply contact 216, thereby increasing the voltage of the output signal. The pull-down signal may selectively turn on the pull-down transistor 208 to conductively connect the output contact 232 to the ground potential 220, thereby decreasing the voltage of the output signal.

The PID circuit 200 may further include a switch transistor 240 coupled in parallel with the first resistor 212 and second resistor 216. For example, a source terminal of the switch transistor 240 may be coupled to a node 244 between the first resistor 212 and the pull-up transistor 204, and a drain terminal of the switch transistor 240 may be coupled to a node 248 between the second resistor 212 and the pull-down transistor 208. A control contact 252 may be coupled to a gate terminal of the switch transistor 240 to receive a control signal. The control signal may switch the switch transistor 240 on or off to control an output impedance at the output contact 232.

In various embodiments, the impedance of the PID circuit 200 may be switchable between a high impedance and a low impedance responsive to the control signal. For example, when the switch transistor 240 is off, the output impedance at the output contact 232 may be equal to the impedance of the first resistor 212 (and the impedance of the second resistor 216), e.g., R. When the switch transistor 240 is on, the output impedance at the output contact 232 may be equal to half the impedance of the first resistor 212 (and half the impedance of the second resistor 216), e.g., R/2.

In various embodiments, for a transmitter circuit 100 including a plurality of the PID circuits 200, the R-comp logic 120 may control the overall impedance presented by the transmitter at the transmission line by controlling the individual switch transistors 240 of the plurality of PID circuits 200 (e.g., using respective control signals generated by the R-comp decoder 124 based on an R-comp code generated by the R-comp logic). For example, the R-comp logic 120 may control the PID circuits 200 to achieve a desired output impedance presented by the transmitter circuit 100. In some embodiments, the R-comp logic 120 may compare the impedance at the transmission lines 104a and/or 104b to a reference impedance that is approximately equal to the desired output impedance, and may switch one or more of the switch transistors 240 on or off to achieve an output impedance that is approximately equal to the reference impedance.

Figure 3:
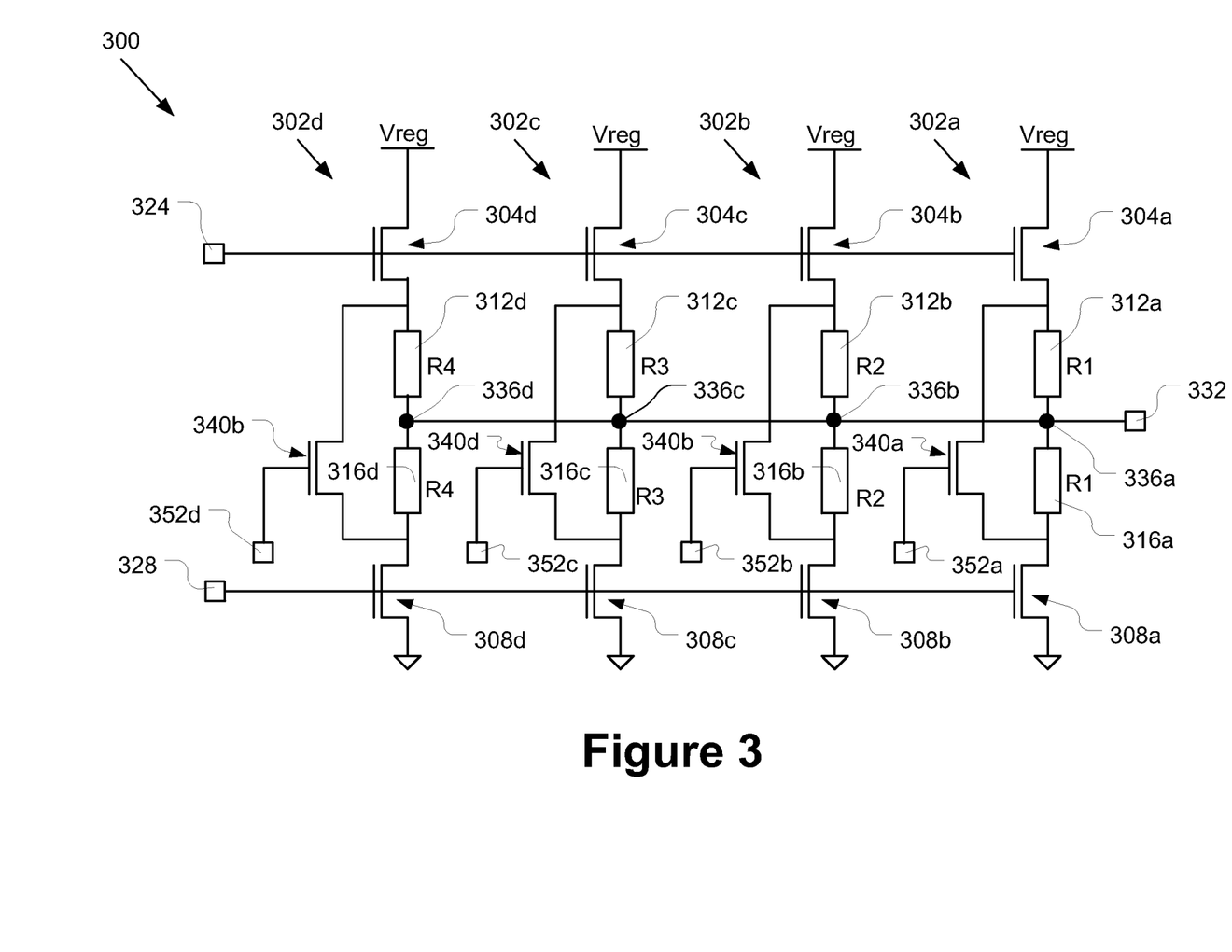
FIG. 3 illustrates another example PID circuit that may be employed by the transmitter circuit of FIG. 1, in accordance with various embodiments.

FIG. 3 schematically illustrates another example of a PID circuit 300 in accordance with various embodiments. The PID circuit 300 may be included in the PID circuits 112a-f of the transmitter circuit 100. The PID circuit 300 may include a plurality of impedance control units 302a-d, with each impedance control unit 302a-d being switchable between a high impedance and a low impedance.

The individual impedance control units 302a-d may include a pull-up transistor 304a-d, a pull-down transistor 308a-d, a first resistor 312, a second resistor 316, and a switch transistor 340 that may be similar to the pull-up transistor 204, pull-down transistor 208, first resistor 212, second resistor 216, and switch transistor 240, respectively, of PID circuit 200. The gate terminals of all of the pull-up transistors 304a-d may be coupled to a pull-up contact 324 to receive a pull-up signal and the gate terminals of all of the pull-down transistors 308a-d may be coupled to a pull-down contact 328 to receive a pull-down signal. An output contact 332 may be coupled to nodes 336a-d between the respective first resistor 312a-d and second resistor 316a-d to pass the output signal for the PID circuit 300 to the output contact 332.

In various embodiments, the gate terminals of the switch transistors 340a-d may be coupled to respective control contacts 352a-d to receive respective control signals. Accordingly, the switch transistors 340a-d may be controlled independently to adjust an overall impedance presented by the PID circuit 300 at the output contact 332.

In various embodiments, the first resistor 312a and second resistor 316b of control unit 302a may have a first impedance value R1, the first resistor 312b and second resistor 316b of control unit 302b may have a second impedance value R2, the first resistor 312c and second resistor 316c of control unit 302c may have a third impedance value R3, and the first resistor 312d and second resistor 316d of control unit 302d may have a fourth impedance value R4. The impedance values R1-R4 may be the same or different, as further discussed below.

The impedance control units 302a-d may be coupled in parallel with one another. Accordingly, for a PID circuit 300 with four control units 302a-d, the PID circuit 300 may be programmed to one of 16 different impedance levels, with a minimum impedance value of the PID circuit 300 equal to (R1//R2//R3//R4)/2 and a maximum impedance value of the PID circuit 300 equal to R1//R2//R3//R4, where the notation R1//R2 represents the impedance value of R1 and R2 connected in parallel.

The PID circuit 300 may include any suitable value for R1, R2, R3, and R4. For example, in some embodiments, the values may conform to the following relationship: R1≥R2≥R3≥R4. In some embodiments, the impedance values R1, R2, R3, and R4 may have a binary relationship, with R2 having an impedance value equal to R1//R1, R3 having an impedance value equal to R1//R1//R1//R1, and R4 having an impedance value equal to R1//R1//R1//R1//R1//R1//R1. In other embodiments, the impedance value of the first and second resistors of at least one of the control units 302a-d may be the same as the impedance value of the first and second resistors of at least one other control unit 302a-d and different from the impedance value of the first and second resistors of at least one other control unit. For example, in one embodiment, R2 may be equal to R1, R3 may be equal to R1//R1, and R4 may be equal to R1//R1//R1.

In some embodiments, each resistor 312a-d and 316a-d may be formed from one or more resistive elements coupled in parallel with one another, with all the resistive elements having the same impedance value. Accordingly, the non-binary configuration of R1, R2, R3, and R4 described above may allow for fewer resistive elements to be used to form the resistors 312a-d and 316a-d than may be used to form a binary relationship between R1, R2, R3, and R4. In yet other embodiments, the impedance values R1, R2, R3, and R4 may all be equal to one another.

In various embodiments, the PID circuits 200 and 300 may include fewer resistors and/or provide a lower pad capacitance than prior voltage-mode driver circuits. Additionally, the PID circuits 200 and 300 may separate the impedance compensation process from the de-emphasis process, so that the processes may be performed independently and one process does not significantly affect the other.

As discussed above, a plurality of the PID circuits 300 may be included in a transmitter circuit (e.g., transmitter circuit 100). In some embodiments, the control units 302a-d of the plurality of PID circuits 300 may be organized into groups that are to receive the same control signal. For example, the control contacts 352a-d of a given group may be coupled together to a common control line to receive the same control signal. In some embodiments, the individual groups may include control units 302a-d of different PID circuits 300.

Figure 4:
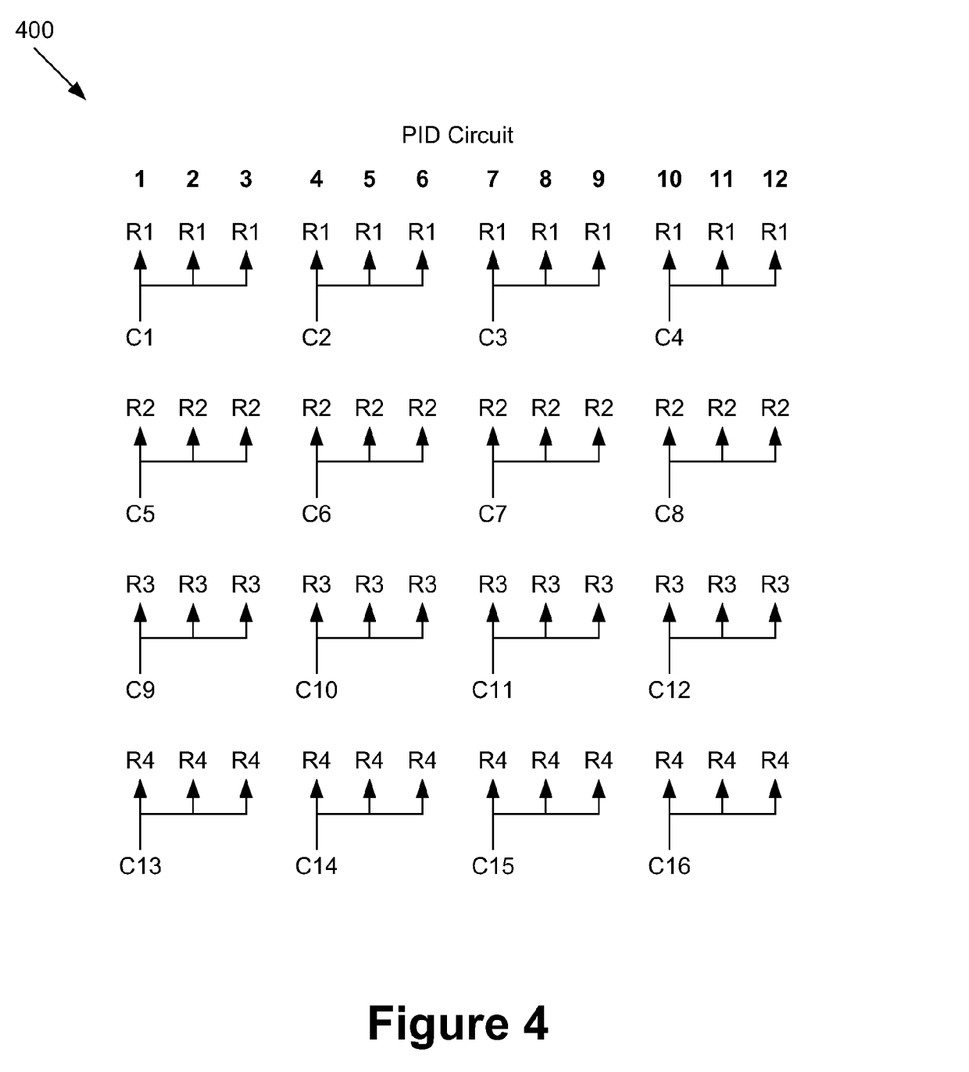
FIG. 4 illustrates an impedance compensation table in accordance with various embodiments.

FIG. 4 illustrates an example impedance compensation table 400 for a transmitter circuit (e.g., transmitter circuit 100) that includes 12 PID circuits 300, with each PID circuit 300 including 4 control units 302a-d. The table 400 represents the control units 302a-d of individual PID circuits 300 as R1-R4, respectively, arranged in columns. The table 400 illustrates 16 groups of control units, with each group including 3 control units 302a-d of the same impedance value (e.g., R1, R2, R3, or R4) from different PID circuits 300. The groups of control units may be controlled by respective control signals C1-C16. The control signals C1-C16 may switch the switch transistor 340a-d of the corresponding control units 302a-d off or on, thereby switching the control units 302a-d between the high impedance value and the low impedance value. The control signals C1-C16 may have a first logic value (e.g., a logic 0) to turn off the associated switch transistors 340a-d or a second logic value (e.g., a logic 1) to turn on the associated switch transistors 340a-d.

In some embodiments, the control signals may be generated from an R-comp code having a number of bits that is less than a number of the groups of control units. For example, 16 control signals may be generated from a 4-bit R-comp control code. Referring again to FIG. 1, the R-comp logic 120 may generate the 4-bit R-comp control code, and the R-comp decoder 124 may generate the R-comp control signals from the R-comp control code.

In some embodiments, the R-comp logic 120 and R-comp decoder 124 may use a thermometer coding scheme. For example, the 4-bit R-comp code may correspond to one of 16 different R-comp settings (e.g., 1 to 16). For an R-comp setting of an integer n, the R-comp decoder 124 may set control signals C1-Cn to turn on their associated switch transistors, and Cn+1–C16 to turn off their associated switch transistors. For example, for an R-comp setting of 7, C1-C7 may be set to turn on their associated switch transistors, and C8-C16 may be set to turn off their associated switch transistors.

With the thermometer coding scheme, there may be 17 possible settings for the control signals C1-C16 (e.g., all logic 0, or 1 to 16 of the control signals having a logic 1). Accordingly, in some embodiments, one of the control signals C1-C16 (e.g., C1 or C16) may be permanently set to the first or second logic value. It will be apparent that other control schemes for the control units 302a-d may be used with the embodiments described herein.

Figure 5:
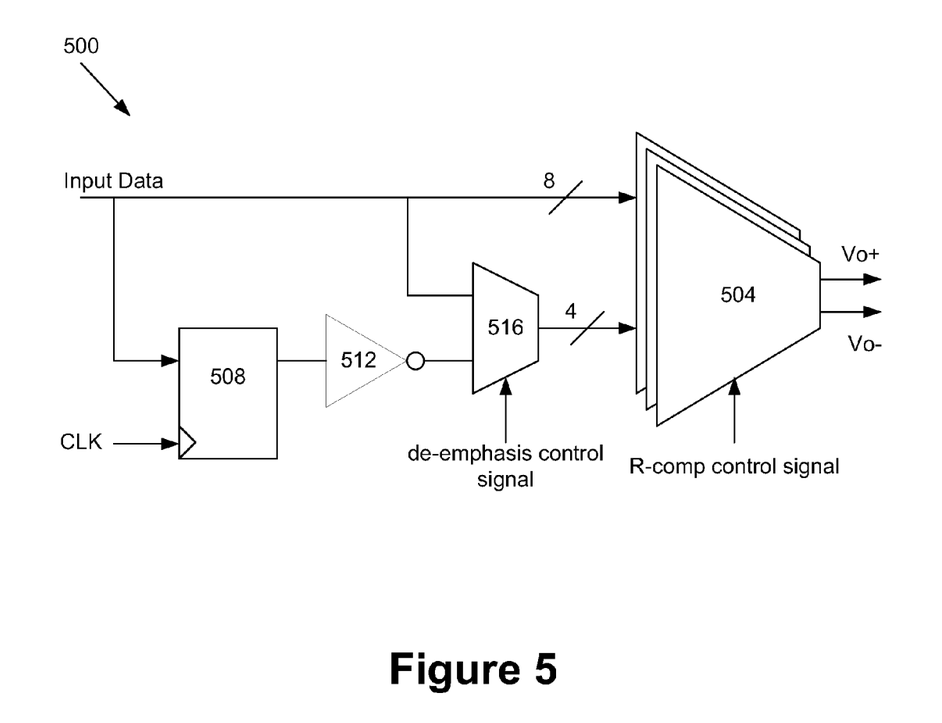
FIG. 5 illustrates de-emphasis circuitry in accordance with various embodiments.

FIG. 5 schematically illustrates de-emphasis circuitry 500 that may be implemented by the transmitter circuit 100 in accordance with various embodiments. For example, the de-emphasis circuitry 500 may be implemented by the de-emphasis circuitry 118 of transmitter circuit 100.

In various embodiments, the de-emphasis circuitry 500 may receive an input data signal and may pass the input data signal to a plurality of drive circuits 504. The individual drive circuits 504 may include driver logic (e.g., driver logic 116a-c) and a bit-slice driver circuit (e.g., bit-slice driver circuit 108a-c) having one or more PID circuits (e.g., PID circuits 112a-f). Any suitable number of drive circuits 504 may be coupled to the de-emphasis circuitry 500. For example, the de-emphasis circuitry 500 shown in FIG. 5 may be coupled to 12 drive circuits 504.

In various embodiments, the de-emphasis circuitry 500 may include a delay flip-flop 508, an inverter 512, and a multiplexer 516. The delay-flip flop 508 may receive the input data signal and an associated clock signal CLK, and may output a delayed version of the input data signal. For example, the delay-flip flop 508 may delay the input data signal by one clock cycle of the clock signal CLK.

The inverter 512 may receive the delayed input data signal and may invert the delayed input data signal. The multiplexer 516 may be coupled to the inverter 512 to receive the delayed and inverted input data signal. The multiplexer 516 may also receive a non-processed input data signal (e.g., the input data signal that has not been delayed and inverted). The multiplexer 516 may be coupled to a plurality of the drive circuits 504. The multiplexer 516 may receive a de-emphasis control signal to control whether the multiplexer 516 passes the delayed and inverted input data signal or the non-processed input data signal to respective drive circuits 504 of the plurality of drive circuits 504 to which the multiplexer 516 is coupled.

In some embodiments, the de-emphasis circuitry 500 may pass the non-processed input data signal to one or more of the drive circuits 504 without passing the input data signal through the multiplexer 516. For example, in the embodiment shown in FIG. 5, 8 of the 12 drive circuits 504 may receive the non-processed input data signal without passing the input data signal through the multiplexer 516 and 4 of the 12 drive circuits 504 may receive either the non-processed input data signal or the delayed and inverted input data signal from the multiplexer.

In various embodiments, the number of drive circuits 504 that receive the delayed and inverted input data signal may be selected to achieve a desired de-emphasis level for the output data signal generated by the drive circuits 504. For example, setting 0, 1, 2, 3, or 4 drive circuits 504 to receive the delayed and inverted input data signal may realize de-emphasis levels of 0 decibels (dB), 1.5 dB, 3.5 dB, 6 dB, or 9.5 dB, respectively. The de-emphasis level may generally correspond to a level of high-pass filtering performed on the input data signal (e.g., to emphasize high frequency components of the input data signal or de-emphasize low-frequency components of the input data signal). The de-emphasis level may be selected to improve the bandwidth of the communication channel on the transmission lines (e.g., transmission lines 104a-b).

As discussed above, the drive circuits 504 may receive one or more R-comp control signals to control an impedance presented by the individual drive circuits 504. In various embodiments, the de-emphasis and impedance compensation may be performed independently to control the de-emphasis level and output impedance, respectively, of the transmitter circuit (e.g., transmitter circuit 100).

Figure 6:
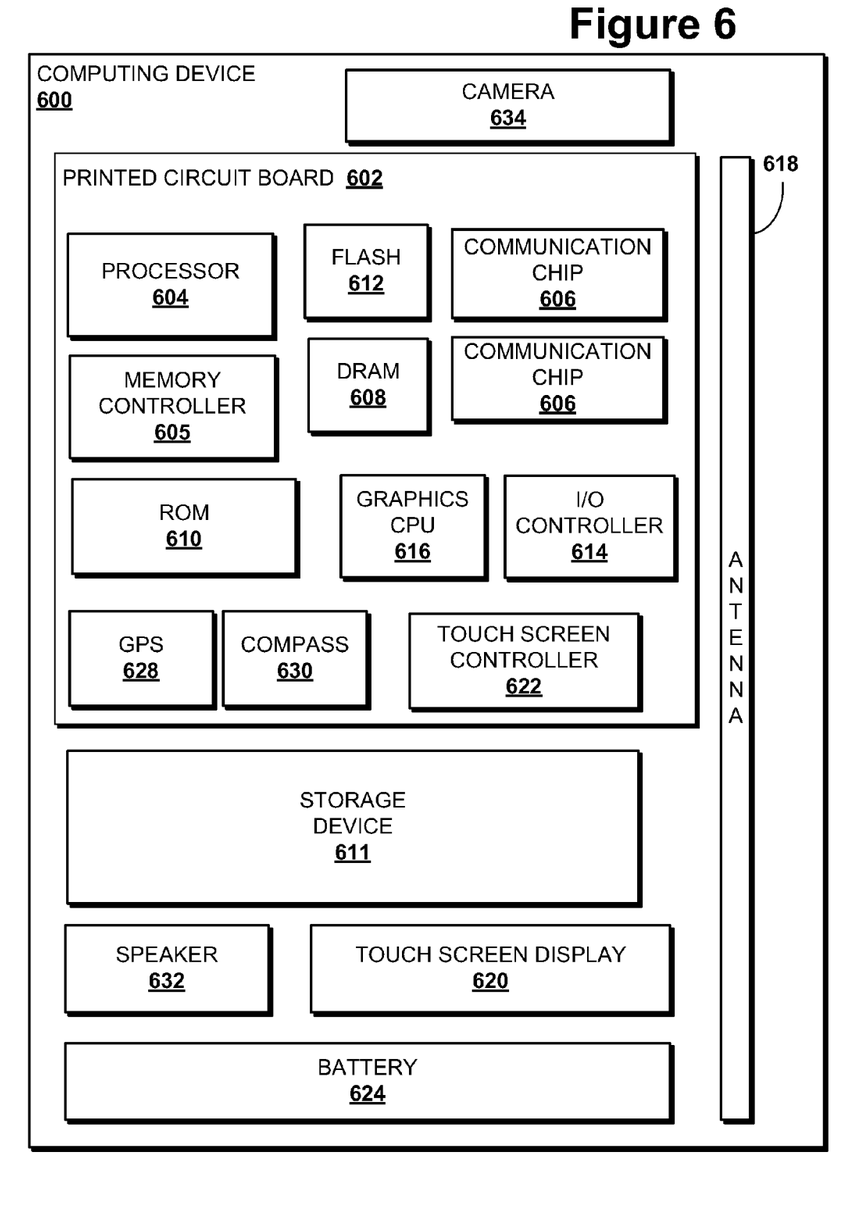
FIG. 6 illustrates an example system configured to employ the apparatuses and methods described herein, in accordance with various embodiments.

FIG. 6 illustrates an example computing device 600 which may employ the apparatuses and/or methods described herein (e.g., transmitter circuit 100, PID 200, PID 300, impedance compensation table 400, de-emphasis circuitry 500), in accordance with various embodiments. As shown, computing device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, memory controller 605, volatile memory (e.g., DRAM 608), non-volatile memory such as read only memory 610 (ROM), flash memory 612, and storage device 611 (e.g., an HDD), an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as hard disk drive, a solid state drive, compact disk (CD), digital versatile disk (DVD)) (not shown), and so forth. In various embodiments, the processor 604 may be integrated on the same die with other components to form a System on Chip (SoC).

In some embodiments, the one or more processor(s), flash memory 612, and/or storage device 611 may include associated firmware (not shown) storing programming instructions configured to enable computing device 600, in response to execution of the programming instructions by one or more processor(s) 604, to practice all or selected aspects of the methods described herein (e.g., the de-emphasis process and/or impedance compensation process). In various embodiments, these aspects may additionally or alternatively be implemented using hardware separate from the one or more processor(s) 604, flash memory 612, or storage device 611.

In various embodiments, one or more components of the computing device 600 may include the transmitter circuit 100 described herein for transmitting data. For example, the transmitter circuit 100 may be included in I/O controller 614, processor 604, memory controller 605, and/or another component of computing device 600. In some embodiments, I/O controller 614 may interface with one or more external devices to transmit a data signal using the transmitter circuit 100. In other embodiments, the transmitter circuit 100 may be used to transmit a data signal between two components of the computing device 600.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 600 may be any other electronic device that processes data.

Some non-limiting Examples are provided below.

Example 1 is a circuit for transmitting a data signal, the circuit comprising: a pull-up transistor to receive a pull-up signal at a gate terminal of the pull-up transistor; a pull-down transistor to receive a pull-down signal at a gate terminal of the pull-down transistor; first and second resistors coupled in series with one another between the pull-up and pull-down transistors; an output contact coupled to a node between the first and second resistors to pass an output signal that is responsive to the pull-up and pull-down signals; a switch transistor coupled in parallel with the first and second resistors; and a control contact coupled to a gate terminal of the switch transistor to receive a control signal to switch the switch transistor on or off to control an impedance at the output contact.

Example 2 is the circuit of Example 1, wherein the first resistor is coupled to a drain terminal of the pull-up transistor and the second resistor is coupled to a source terminal of the pull-down transistor.

Example 3 is the circuit of Example 2, wherein a source terminal of the pull-up transistor is coupled to a supply contact to receive a supply voltage, and wherein a drain terminal of the pull-down transistor is coupled to a ground potential.

Example 4 is the circuit of Example 1, wherein the pull-up, pull-down, and switch transistors, the first and second resistors, and the control contact are included in a first control unit, and wherein the circuit includes a programmable impedance driver circuit (PID) having a plurality of control units including the first control unit, wherein the individual control units receive separate control signals to control the output impedance at the output contact.

Example 5 is the circuit of Example 4, wherein the PID circuit includes four control units.

Example 6 is the circuit of Example 4, wherein an impedance value of the first resistor of the first control unit is different from an impedance value of the first resistor of a second control unit of the plurality of control units.

Example 7 is the circuit of Example 6, wherein the impedance value of the first resistor of the first control unit is also the same as an impedance value of the first resistor of a third control unit of the plurality of control units.

Example 8 is the circuit of any one of Examples 4 to 7, wherein the circuit includes a plurality of PID circuits, the output contacts of the plurality of PID circuits coupled in parallel with one another.

Example 9 is the PID circuit of Example 8, wherein a plurality of control contacts associated with different PID circuits are coupled together to receive a same control signal.

Example 10 is the PID circuit of Example 8, further comprising: driver logic coupled to individual PID circuits, the driver logic to receive an input data signal and to generate respective pull-up and pull-down signals for the PID circuit; and de-emphasis circuitry to pass a delayed and inverted version of the input data signal to a number of the driver logic, wherein the number is programmable.

Example 11 is a circuit for transmitting a data signal, the circuit comprising: impedance compensation circuitry to generate a plurality of control signals to control an impedance on a transmission line; and a plurality of programmable impedance driver (PID) circuits coupled to the impedance compensation circuitry, the PID circuits coupled in parallel with one another to drive an output signal on the transmission line, wherein the individual PID circuits include a plurality of control units, wherein an impedance of the individual control units is switchable between a high impedance and a low impedance responsive to one of the plurality of control signals, and wherein the control units are organized into groups that are to receive the same control signal, at least one of the groups including control units from different PID circuits.

Example 12 is the circuit of Example 11, wherein at least one of the PID circuits includes a first control unit, a second control unit, and a third control unit, and wherein the high impedance of the first control unit is the same as the high impedance of the second control unit and different from the high impedance of the third control unit.

Example 13 is the circuit of Example 12, wherein the at least one PID circuit further includes a fourth control unit that has a high impedance that is different from the high impedance of the first, second, and third control units.

Example 14 is the circuit of Example 11, wherein the impedance compensation circuitry includes R-comp logic to generate an R-comp code, and an R-comp decoder to generate the control signals based on the R-comp code, wherein a number of bits of the R-comp code is less than a number of the groups of control units.

Example 15 is the circuit of Example 11, wherein the control units included in the individual groups have a same high impedance value.

Example 16 is the circuit of any one of Examples 11 to 15, wherein the individual control units include: a pull-up transistor to receive a pull-up signal at a gate terminal of the pull-up transistor; a pull-down transistor to receive a pull-down data signal at a gate terminal of the pull-down transistor; first and second resistors coupled in series with one another between the pull-up and pull-down transistors, wherein an output contact is coupled to a node between the first and second resistors of all the control units of individual PID circuits; and a switch transistor coupled in parallel with the first and second resistors, the switch transistor to receive the respective control signal at a gate terminal of the third transistor to switch the switch transistor on or off to switch between the high impedance and the low impedance.

Example 17 is a system for transmitting a data signal, the system comprising: a processor; and a transmitter circuit coupled to the processor to transmit a data signal to or from the processor via a transmission line, the transmitter circuit including a plurality of programmable impedance driver (PID) circuits coupled in parallel with one another to drive the data signal on the transmission line. The individual PID circuits include: a first input terminal to receive a pull-up signal; a second input terminal to receive a pull-down signal; a first output contact to pass an output signal to the transmission line; and one or more control units. The control units include: a pull-up transistor to receive the pull-up signal at a gate terminal of the pull-up transistor; a pull-down transistor to receive the pull-down signal at a gate terminal of the pull-down transistor; first and second resistors coupled in series with one another between the pull-up and pull-down transistors, wherein the output contact is coupled to a node between the first and second resistors; and a switch transistor coupled in parallel with the first and second resistors, the switch transistor to receive a control signal at a gate terminal of the third transistor to switch the switch transistor on or off to control an output impedance at the output contact.

Example 18 is the system of Example 17, wherein the transmitter circuit further comprises driver logic to receive an input data signal to be transmitted and to generate the pull-up and pull-down signals based on the input data signal.

Example 19 is the system of Example 17, wherein the transmitter circuit further comprises a de-emphasis circuit to receive an input data signal and to pass a delayed and inverted version of the input data signal to a number of the driver logic, wherein the number is programmable.

Example 20 is the system of Example 17, wherein the data signal is a positive data signal, the transmission line is a positive transmission line, and the plurality of PID circuits are positive PID circuits, and wherein the transmitter circuit further includes a plurality of negative PID circuits to drive a negative data signal on a negative transmission line to form a differential data signal with the positive data signal.

Example 21 is the system of Example 17, wherein a first PID circuit of the plurality of PID circuits includes a plurality of control units including first, second, and third control units, and wherein an impedance value of the first resistor of the first control unit is the same as an impedance value of the first resistor of the second control unit and different from an impedance value of the first resistor of the third control unit.

Example 22 is the system of any one of Examples 17 to 21, wherein a plurality of control units from different PID circuits are to receive the same control signal.

Example 23 is the system of any one of Examples 17 to 21, further comprising impedance compensation circuitry to compare an impedance on the transmission line to a reference impedance and to control the switch transistors of the control units based on the comparison.

Example 24 is a method for transmitting a data signal, the method comprising: generating a plurality of control signals to control an impedance on a transmission line; and passing respective control signals to individual groups of programmable impedance driver (PID) circuits, the PID circuits coupled in parallel with one another to drive an output signal on the transmission line, wherein the individual PID circuits include a plurality of control units, wherein an impedance of the individual control units is switchable between a high impedance and a low impedance responsive to one of the plurality of control signals, and wherein the groups of control units are to receive the same control signal, at least one of the groups including control units from different PID circuits.

Example 25 is the method of claim 24, wherein at least one of the PID circuits includes a first control unit, a second control unit, and a third control unit, and wherein the high impedance of the first control unit is the same as the high impedance of the second control unit and different from the high impedance of the third control unit.

Example 26 is the method of claim 25, wherein the at least one PID circuit further includes a fourth control unit that has a high impedance that is different from the high impedance of the first, second, and third control units.

Example 27 is the method of claim 24, wherein the generating the plurality of control signals includes: generating an R-comp code having a plurality of bits; and generating the control signals based on the R-comp code, wherein a number of bits in the R-comp code is less than a number of the groups of control units.

Example 28 is the method of claim 24, wherein the control units included in the individual groups have a same high impedance value.

Example 29 is the method of claim 24, wherein the individual control units include: a pull-up transistor to receive a pull-up signal at a gate terminal of the pull-up transistor; a pull-down transistor to receive a pull-down data signal at a gate terminal of the pull-down transistor; first and second resistors coupled in series with one another between the pull-up and pull-down transistors, wherein an output contact is coupled to a node between the first and second resistors of all the control units of individual PID circuits;

and a switch transistor coupled in parallel with the first and second resistors, the switch transistor to receive the respective control signal at a gate terminal of the third transistor to switch the switch transistor on or off to switch between the high impedance and the low impedance.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   a plurality of programmable impedance driver (PID) circuits coupled in parallel with a same output terminal to drive a transmission signal on a transmission line coupled to the output terminal, wherein individual PID circuits of the plurality of PID circuits include:
   a pull-up transistor to receive a pull-up signal at a gate terminal of the pull-up transistor;
   a pull-down transistor to receive a pull-down signal at a gate terminal of the pull-down transistor;
   first and second resistors coupled in series with one another between the pull-up and pull-down transistors;
   an output contact coupled between the output terminal and a node between the first and second resistors to pass an output signal to the output terminal that is responsive to the pull-up and pull-down signals;
   a switch transistor coupled in parallel with the first and second resistors; and
   a control contact coupled to a gate terminal of the switch transistor to receive a control signal to switch the switch transistor on or off to control an impedance at the output contact.

2. The circuit of claim 1, wherein the first resistor is coupled to a drain terminal of the pull-up transistor and the second resistor is coupled to a source terminal of the pull-down transistor.

3. The circuit of claim 2, wherein a source terminal of the pull-up transistor is coupled to a supply contact to receive a supply voltage, and wherein a drain terminal of the pull-down transistor is coupled to a ground potential.

4. The circuit of claim 1, wherein the pull-up, pull-down, and switch transistors, the first and second resistors, and the control contact are included in a first control unit, and wherein the individual PID circuits include a plurality of control units including the first control unit, wherein the plurality of control units are coupled to the output contact and receive the same pull-up and pull-down signals, and wherein individual control units receive separate control signals to control the output impedance at the output contact.

5. The circuit of claim 4, wherein the individual PID circuits include four control units.

6. The circuit of claim 4, wherein an impedance value of the first resistor of the first control unit is different from an impedance value of the first resistor of a second control unit of the plurality of control units.

7. The circuit of claim 6, wherein the impedance value of the first resistor of the first control unit is also the same as an impedance value of the first resistor of a third control unit of the plurality of control units.

8. The circuit of claim 1, wherein a plurality of control contacts associated with different PID circuits corresponding to a subset of the plurality of PID circuits are coupled together to receive a same control signal.

9. The circuit of claim 1, further comprising:
   driver logic coupled to individual PID circuits, the driver logic to receive an input data signal and to generate respective pull-up and pull-down signals for the PID circuit; and
   de-emphasis circuitry to pass a delayed and inverted version of the input data signal to a number of the driver logic, wherein the number is programmable.

10. A circuit comprising:
    impedance compensation circuitry to generate a plurality of control signals to control an impedance on a transmission line; and
    a plurality of programmable impedance driver (PID) circuits coupled to the impedance compensation circuitry, the PID circuits coupled in parallel with one another to drive an output signal on the transmission line, wherein individual PID circuits include a plurality of control units, wherein an impedance of individual control units is switchable between a high impedance and a low impedance responsive to one of the plurality of control signals, and wherein the control units are organized into groups that are to receive the same control signal, at least one of the groups including control units from different PID circuits;
    wherein the individual control units include:
    a pull-up transistor to receive a pull-up signal at a gate terminal of the pull-up transistor;
    a pull-down transistor to receive a pull-down signal at a gate terminal of the pull-down transistor;
    first and second resistors coupled in series with one another between the pull-up and pull-down transistors, wherein an output contact is coupled to a node between the first and second resistors of all the control units of individual PID circuits; and
    a switch transistor coupled in parallel with the first and second resistors, the switch transistor to receive the respective control signal at a gate terminal of the switch transistor to switch the switch transistor on or off to switch between the high impedance and the low impedance.

11. The circuit of claim 10, wherein at least one of the PID circuits includes a first control unit, a second control unit, and a third control unit, and wherein the high impedance of the first control unit is the same as the high impedance of the second control unit and different from the high impedance of the third control unit.

12. The circuit of claim 11, wherein the at least one PID circuit further includes a fourth control unit that has a high impedance that is different from the high impedance of the first, second, and third control units.

13. The circuit of claim 10, wherein the impedance compensation circuitry includes R-comp logic to generate an R-comp code, and an R-comp decoder to generate the control signals based on the R-comp code, wherein a number of bits of the R-comp code is less than a number of the groups of control units.

14. The circuit of claim 10, wherein the control units included in the individual groups have a same high impedance value.

15. A system comprising:

a processor;

a transmitter circuit coupled to the processor to transmit a data signal to or from the processor via a transmission line, the transmitter circuit including a plurality of programmable impedance driver (PID) circuits coupled in parallel with one another to drive the data signal on the transmission line, wherein individual PID circuits include:

a first input terminal to receive a pull-up signal;

a second input terminal to receive a pull-down signal;

a first output contact to pass an output signal to the transmission line; and one or more control units including:

a pull-up transistor to receive the pull-up signal at a gate terminal of the pull-up transistor;

a pull-down transistor to receive the pull-down signal at a gate terminal of the pull-down transistor;

first and second resistors coupled in series with one another between the pull-up and pull-down transistors, wherein the output contact is coupled to a node between the first and second resistors; and a switch transistor coupled in parallel with the first and second resistors, the switch transistor to receive a control signal at a gate terminal of the switch transistor to switch the switch transistor on or off to control an output impedance at the output contact.

16. The system of claim 15, wherein the transmitter circuit further comprises driver logic to receive an input data signal to be transmitted and to generate the pull-up and pull-down signals based on the input data signal.

17. The system of claim 16, wherein the transmitter circuit further comprises a de-emphasis circuit to receive an input data signal and to pass a delayed and inverted version of the input data signal to a number of the driver logic, wherein the number is programmable.

18. The system of claim 15, wherein the data signal is a positive data signal, the transmission line is a positive transmission line, and the plurality of PID circuits are positive PID circuits, and wherein the transmitter circuit further includes a plurality of negative PID circuits to drive a negative data signal on a negative transmission line to form a differential data signal with the positive data signal.

19. The system of claim 15, wherein a first PID circuit of the plurality of PID circuits includes a plurality of control units including first, second, and third control units, and wherein an impedance value of the first resistor of the first control unit is the same as an impedance value of the first resistor of the second control unit and different from an impedance value of the first resistor of the third control unit.

20. The system of claim 15, wherein a plurality of control units from different PID circuits are to receive the same control signal.

21. The system of claim 15, further comprising impedance compensation circuitry to compare an impedance on the transmission line to a reference impedance and to control the switch transistors of the control units based on the comparison.

* * * * *